(12) United States Patent
Deak et al.

(10) Patent No.: US 11,636,889 B2
(45) Date of Patent: Apr. 25, 2023

(54) AUTOMATIC MAGNETIC FLOW RECORDING DEVICE

(71) Applicant: MultiDimension Technology Co., Ltd., Zhangjiagang (CN)

(72) Inventors: James Geza Deak, Zhangjiagang (CN); Haiping Guo, Zhangjiagang (CN); Xiaofeng Cheng, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 327 days.

(21) Appl. No.: 15/549,108

(22) PCT Filed: Feb. 2, 2016

(86) PCT No.: PCT/CN2016/073175
§ 371 (c)(1),
(2) Date: Aug. 4, 2017

(87) PCT Pub. No.: WO2016/124131
PCT Pub. Date: Aug. 11, 2016

(65) Prior Publication Data
US 2018/0033474 A1  Feb. 1, 2018

(30) Foreign Application Priority Data
Feb. 4, 2015  (CN) .......................... 201510058471.2

(51) Int. Cl.
*G11C 11/02*  (2006.01)
*G01B 7/30*  (2006.01)
(Continued)

(52) U.S. Cl.
CPC ................ *G11C 11/02* (2013.01); *G01B 7/30* (2013.01); *G01D 5/145* (2013.01); *G01F 15/066* (2013.01); *G01R 33/091* (2013.01); *G01R 33/093* (2013.01)

(58) Field of Classification Search
CPC .. G01D 5/12; G01D 5/14; G01D 5/16; G01D 5/145; G01R 33/09; G01R 33/091;
(Continued)

(56) References Cited

U.S. PATENT DOCUMENTS 6,104,186 A * 8/2000 Yamada ..................... F02P 7/07
324/174
6,819,292 B2 * 11/2004 Winter ................... G01D 4/006
343/702
(Continued)

FOREIGN PATENT DOCUMENTS

CN  101629802  1/2010
CN  101918796  12/2010
(Continued)

OTHER PUBLICATIONS

"International Application No. PCT/CN2016/073175, International Search Report and Written Opinion dated Apr. 22, 2016", (dated Apr. 22, 2016), 14 pgs.
(Continued)

*Primary Examiner* — Justin N Olamit
(74) *Attorney, Agent, or Firm* — Schwegman Lundberg & Woessner, P.A.

(57) ABSTRACT

An automatic magnetic flow recording device, comprises a multitude of coaxially disposed hard magnetic rotating wheels wherein the hard magnetic rotating wheels are circular, and rotate with respect to each other by a predetermined transmission ratio. Each hard magnetic rotating wheel has at least one corresponding biaxial magnetoresistive
(Continued)

angle sensor. The biaxial magnetoresistive angle sensors measure the angular positions of the hard magnetic rotating wheels within the range of 0-360 degrees. The biaxial magnetoresistive angle sensors comprise two single-axis linear magnetoresistive sensors, wherein the single-axis linear magnetoresistive sensors are an X-axis magnetoresistive sensor or a Z-axis magnetoresistive sensor. The X-axis magnetoresistive sensor of the hard magnetic rotating wheel measures a magnetic field component parallel to the tangent of the circumference of the hard magnetic rotating wheel. The Z-axis magnetoresistive sensor of the hard magnetic rotating wheel measures a magnetic field component along the radial direction of the hard magnetic rotating wheel. This flow meter recording device has several advantages compared to electronic flow meters with X, Y biaxial angle sensor. These include flexibility of the mounting position, small adjacent hard magnetic rotating wheel interference, and low power consumption.

13 Claims, 4 Drawing Sheets

(51) Int. Cl.
  *G01D 5/14* (2006.01)
  *G01R 33/09* (2006.01)
  *G01F 15/06* (2022.01)
(58) Field of Classification Search
  CPC ........ G01R 33/093; G11C 11/02; G01B 7/30; G01F 15/066
  See application file for complete search history.

(56) References Cited

U.S. PATENT DOCUMENTS

| | | | |
|---|---|---|---|
| 7,030,608 B2 * | 4/2006 | Kawashima | G01D 5/145 324/207.25 |
| 7,307,415 B2 * | 12/2007 | Seger | G01D 5/04 324/207.2 |
| 8,587,295 B2 * | 11/2013 | Aimuta | G01D 3/02 324/207.24 |
| 8,952,683 B2 * | 2/2015 | Granig | G01D 5/145 324/207.21 |
| 9,341,695 B2 * | 5/2016 | Kitamoto | G01D 3/08 |
| 9,389,099 B2 * | 7/2016 | Deak | G01D 5/2497 |
| 9,442,168 B2 | 9/2016 | Paci et al. | |
| 9,575,143 B2 * | 2/2017 | Deak | G01R 33/098 |
| 9,651,636 B2 * | 5/2017 | Fu | G01R 33/096 |
| 9,823,090 B2 * | 11/2017 | Foletto | G01D 5/14 |
| 10,473,449 B2 | 11/2019 | Deak et al. | |
| 10,690,515 B2 | 6/2020 | Deak et al. | |
| 2005/0253578 A1 | 11/2005 | Kawashima et al. | |
| 2008/0231266 A1 | 9/2008 | Hayashi et al. | |
| 2009/0027048 A1 | 1/2009 | Sato et al. | |
| 2011/0068780 A1 | 3/2011 | Sakai | |
| 2013/0099783 A1 | 4/2013 | Kubik | |
| 2013/0010641 A1 | 5/2013 | Liu et al. | |
| 2013/0116941 A1 * | 5/2013 | Lie-Nielsen | G01F 15/063 702/46 |
| 2013/0335073 A1 | 12/2013 | Deak et al. | |
| 2014/0225605 A1 | 8/2014 | Lei et al. | |
| 2017/0268864 A1 | 9/2017 | Deak et al. | |
| 2017/0356764 A1 | 12/2017 | Deak et al. | |

FOREIGN PATENT DOCUMENTS

| | | |
|---|---|---|
| CN | 102297652 | 12/2011 |
| CN | 102298124 A | 12/2011 |
| CN | 102419425 | 4/2012 |
| CN | 102628703 * | 8/2012 |
| CN | 103901363 | 7/2014 |
| CN | 103913183 | 7/2014 |
| CN | 104197827 | 12/2014 |
| CN | 104197828 | 12/2014 |
| CN | 204043603 | 12/2014 |
| CN | 204043604 | 12/2014 |
| CN | 104596605 | 5/2015 |
| CN | 204535800 | 8/2015 |
| DE | 19538163 | 3/1997 |
| JP | 2000321014 | 11/2000 |
| JP | 2003075108 | 3/2003 |
| WO | WO-2005031257 A2 | 4/2005 |
| WO | WO-2016026412 | 2/2016 |
| WO | WO-2016026419 | 2/2016 |
| WO | WO-2016124131 | 8/2016 |

OTHER PUBLICATIONS

"U.S. Appl. No. 15/504,981, Preliminary Amendment filed Feb. 17, 2017", 3 pgs.
"U.S. Appl. No. 15/504,981, Supplemental Preliminary Amendment filed Aug. 23, 2017", 7 pgs.
"U.S. Appl. No. 15/504,981, Advisory Action dated Nov. 7, 2018", 3 pgs.
"U.S. Appl. No. 15/504,981, Ex Parte Quayle Action mailed Oct. 22, 2019", 6 pgs.
"U.S. Appl. No. 15/504,981, Final Office Action dated Aug. 27, 2018", 17 pgs.
"U.S. Appl. No. 15/504,981, Non Final Office Action dated Feb. 23, 2018", 16 pgs.
"U.S. Appl. No. 15/504,981, Non Final Office Action dated Mar. 28, 2019", 13 pgs.
"U.S. Appl. No. 15/504,981, Notice of Allowance dated Feb. 18, 2020", 7 pgs.
"U.S. Appl. No. 15/504,981, Response filed May 23, 2018 to Non Final Office Action dated Feb. 23, 2018", 9 pgs.
"U.S. Appl. No. 15/504,981, Response filed Dec. 19, 2019 to Ex Parte Quayle Action mailed Oct. 22, 2019", 7 pgs.
"U.S. Appl. No. 15/504,981, Response filed Jul. 25, 2019 to Non-Final Office Action dated Mar. 28, 2019", 12 pgs.
"U.S. Appl. No. 15/504,981, Response fled Oct. 24, 2018 to Final Office Action dated Aug. 27, 2018", 10 pgs.
"U.S. Appl. No. 15/505,236, Notice of Allowance dated Jul. 3, 2019", 10 pgs.
"U.S. Appl. No. 15/505,236, Preliminary Amendment filed Feb. 20, 2017", 12 pgs.
"International Application No. PCT/CN2015/087215, International Search Report and Written Opinion dated Oct. 28, 2015", (dated Oct. 28, 2015), 10 pgs.
"International Application No. PCT/CN2015/087320, International Search Report and Written Opinion dated Nov. 12, 2015", (dated Nov. 12, 2015), 12 pgs.

* cited by examiner

[Y axis label: Magnetic field angle of intersection (degrees)]

[Y axis label: Magnetic field (a.u.)]

AUTOMATIC MAGNETIC FLOW RECORDING DEVICE

PRIORITY CLAIM TO RELATED APPLICATIONS

This application is a U.S. national stage application filed under 35 U.S.C. § 371 from International Application Serial No. PCT/CN2016/073175, which was filed 2 Feb. 2016, and published as WO2016/124131 on 11 Aug. 2016, and which claims priority to Chinese Application No. 201510058471.2, filed 4 Feb. 2015, which applications and publication are incorporated by reference as if reproduced herein and made a part hereof in their entirety, and the benefit of priority of each of which is claimed herein.

TECHNICAL FIELD

The present invention relates to the technical field of magnetic sensors, and more specifically, to an automatic magnetic flow recording device.

BACKGROUND ART

Direct reading flow recording devices, such as water meters, employ a plurality of rotating wheels, the rotating wheels are coaxial, and adjacent rotating wheels have a fixed transmission ratio, such as 10:1, i.e.: only when the first rotating wheel makes 10 rotations does the second rotating wheel make 1 rotation, and so on. Also, the first rotating wheel is directly connected to a spiral driven by the water flow; by recording the number of revolutions of the spiral, the water meter represents the water flow. Because a transmission ratio of 10:1 conforms to decimal system characteristics, each rotating wheel is actually equivalent to a digit of a decimal number. In addition, all rotating wheels are marked as numbers 0-9 based on the angle, thus making up a direct reading water meter. Digital technology is often employed in the actual process, using angle sensors to directly monitor the angular position of rotation of each of the rotating wheels within a range of 0-360 degrees. A commonly employed technology is optical encoder technology, using grating to detect the rotation angle. This technology features the following problems:

Grating technology features high environmental requirements, requiring a clean environment, free of oil, smoke, gas, and dust, all of which are likely to influence grating detection;

Substitute technologies involve the use of magnetic angle sensor technologies, and magnetoresistive sensors such as TMR and GMR employ plane X-Y magnetoresistive angle sensor chips. They achieve measurement of a permanent magnet encoder rotation angle by measuring the magnetic field components in the X and Y directions on the same chip and calculating the angle of intersection between the X magnetic field component and Y magnetic field component. However, the following key problems exist:

1) When an X-Y magnetoresistive angle sensor chip and circular permanent magnet encoder are used together to measure angular position, the chip's measurement plane is positioned above a position parallel to the upper and lower bottom face region of the circular permanent encoder, and the sensitive magnetic field it measures comes from the magnetic fields of the circular permanent magnet encoder distributed above the upper and lower bottom face of the circular permanent encoder. Therefore, the mounting space and uniform magnetic field region of the X-Y magnetoresistive angle sensor chip are limited, and its spatial flexibility is poor;

2) The rotating magnetic field distribution at the upper and lower bottom face of the X-Y magnetoresistive angle sensor chip's circular permanent magnet encoder is vulnerable to interference from nearby magnets such as soft magnetic materials or permanent magnets. This causes changes in the angle measurement region and makes it impossible to correctly obtain angle measurements, and stability is poor.

To resolve these problems, patent applications numbered 201410411628.0 (corresponding to U.S. Pat. No. 10,473,449) and 201410406142.8 (corresponding to U.S. Pat. No. 10,690,515) published two different solutions in succession, applying to a magnetoresistive angle sensor with a single hard magnetic rotating wheel. The former is a single chip off-axis magnetoresistive Z-X angle sensor, integrating X and Z axis magnetoresistive sensors on the same substrate. Through measurements of the X magnetic field component and Z magnetic field component by the X and Z axis magnetoresistive sensors, voltage curves are separately output, and the angle of intersection relationship between the two is determined. Thus it is possible to achieve angle measurement of the single hard magnetic rotating wheel. The latter measures the two orthogonal magnetic field components through measurement of the magnetic field signals of dual z axis magnetoresistive sensors positioned at equal distances above the circumference of the hard magnetic rotating wheel and spanning the circumference at 90 degrees, and calculates the angle of intersection of the magnetic fields, thus determining the angular position of rotation of the hard magnetic rotating wheel. Here, the X direction is defined as the tangential direction of the hard magnetic rotating wheel at the position of the sensor, and the Z direction is defined as the direction of the hard magnetic rotating wheel along the diameter at the position of the sensor. The two patents describe Z-X angle sensor chip structures and types, and the structures of a Z axis magnetoresistive sensor and an X axis magnetoresistive sensor.

Z-X biaxial angle sensors and dual Z axis angle sensors have greater mounting flexibility than X-Y biaxial angle sensors. Also, Z-X biaxial angle sensors and dual z axis angle sensors are well suited for measuring the angle of permanent magnetic rotating wheels. In addition, the present invention discloses the use of a dual X axis magnetoresistive sensor to measure the X direction, i.e.: the magnetic field along the tangential direction, to achieve measurement of the angle of the rotating wheels.

Because the flow meter is an assembly of a plurality of permanent magnetic rotating wheels, coaxial and with a fixed transmission ratio, the abovementioned Z-X biaxial angle sensor applicable to a single rotating wheel as well as dual z axis angle sensors and X axis angle sensors are fully capable of being used to measure the angle of the plurality of rotating wheels of the flow meter.

DETAILS OF THE INVENTION

Taking aim at these problems, the present invention presents an automatic magnetic flow recording device to replace the X-Y magnetoresistive angle sensor. It measures the radial rotating magnetic field generated at the outer edge of the round face of a circular permanent magnetic rotating wheel in place of the rotating magnetic field located above the upper and lower bottom face of the circular permanent magnet encoder, and it employs two separate Z axis or X axis magnetoresistive sensor chips with a phase difference of 90 degrees or a single chip X-Z biaxial magnetoresistive angle sensor in place of a single X-Y magnetoresistive sensor chip. Because the magnetoresistive sensor chip is located outside the round face of the circular permanent magnet encoder, its mounting flexibility is vastly enhanced.

To achieve these goals, the technical schemes of the embodiments of the present invention are as follows:

An automatic magnetic flow recording device, wherein the automatic magnetic flow recording device comprises a plurality of coaxially disposed, hard magnetic rotating wheels, wherein the hard magnetic rotating wheels are circular and have a predetermined turning ratio with respect to each other; each hard magnetic rotating wheel has at least one corresponding biaxial magnetoresistive angle sensor, wherein the biaxial magnetoresistive angle sensor measures the angular position of the hard magnetic rotating wheel within a range of 0-360 degrees; the biaxial magnetoresistive angle sensor comprises at least two single-axis linear magnetoresistive sensors, wherein the single-axis linear magnetoresistive sensors are X axis magnetoresistive sensors or Z axis magnetoresistive sensors, the hard magnetic rotating wheel has a magnetization direction parallel to the diameter, the biaxial magnetoresistive angle sensor is positioned beyond the side surface of the cylinder of the corresponding hard magnetic rotating wheel, the X axis magnetoresistive sensor measures the magnetic field component tangential to the circumference of the hard magnetic rotating wheel at the position of the hard magnetic rotating wheel, and the Z axis magnetoresistive sensor measures the magnetic field component radial to the hard magnetic rotating wheel at the position of the hard magnetic rotating wheel.

As a further improvement of the present invention, the biaxial magnetoresistive angle sensor comprises an X axis magnetoresistive sensor chip or Z axis magnetoresistive sensor chip or single chip Z-X biaxial magnetoresistive angle sensor, wherein the X axis magnetoresistive sensor chip or Z axis magnetoresistive sensor chip or single chip Z-X biaxial magnetoresistive angle sensor is located in the heightwise uniform magnetic field region of the corresponding permanent magnetic rotating wheel.

As a further improvement of the present invention, the biaxial magnetoresistive angle sensor comprises dual x axis magnetoresistive sensor chips or dual z axis magnetoresistive sensor chips or one X-Z biaxial magnetoresistive sensor, and the X axis magnetoresistive sensor chips or Z axis magnetoresistive sensor chips have the same magnetic field sensitivity.

As a further improvement of the present invention, the biaxial magnetoresistive angle sensor is a pair of Z axis magnetoresistive angle sensors, comprising dual z axis magnetoresistive sensor chips; the Z axis magnetoresistive sensor chips comprise at least one Z axis magnetoresistive sensor unit, and the dual z axis magnetoresistive sensor chips are located at two positions over the circumference of the corresponding hard magnetic rotating wheel spanning a 90 degree arc and at the same distance away from the circumference of the hard magnetic rotating wheel.

As a further improvement of the present invention, the biaxial magnetoresistive angle sensor is a pair of X axis magnetoresistive angle sensors, comprising dual x axis magnetoresistive sensor chips; the X axis magnetoresistive sensor chips comprise at least one X axis magnetoresistive sensor unit, and the dual x axis magnetoresistive sensor chips are located at two positions over the circumference of the corresponding hard magnetic rotating wheel spanning a 90 degree arc and at the same distance away from the circumference of the hard magnetic rotating wheel.

As a further improvement of the present invention, the biaxial magnetoresistive angle sensor is a single chip X-Z biaxial magnetoresistive angle sensor, comprising an X axis magnetoresistive sensor and Z axis magnetoresistive sensor integrated on the same substrate; the single chip X-Z biaxial magnetoresistive angle sensor is positioned above the circumference of the corresponding hard magnetic rotating wheel.

As a further improvement of the present invention, there are soft magnetic materials between the hard magnetic rotating wheels for magnetic shielding, to reduce magnetic field interference among the hard magnetic rotating wheels.

As a further improvement of the present invention, the automatic magnetic flow recording device also comprises a PCB, and the X axis magnetoresistive sensor chip or Z axis magnetoresistive sensor chip or single chip Z-X biaxial magnetoresistive angle sensor is directly connected to the PCB.

As a further improvement of the present invention, the automatic magnetic flow recording device also comprises a switch selection circuit; the switch selection circuit controls the connection of the power source input terminal to the power source for each biaxial magnetoresistive angle sensor; when reading information for each hard magnetic rotating wheel, it is necessary to use the switch selection circuit to place the biaxial magnetoresistive angle sensor corresponding to the hard magnetic wheel in operating mode; when it is not necessary to read the hard magnetic rotating wheel, the switch circuit places the biaxial magnetoresistive angle sensor corresponding to the hard magnetic rotating wheel in power-off mode.

As a further improvement of the present invention, the automatic magnetic flow recording device also comprises a microprocessor; the output signal of the biaxial magnetoresistive angle sensor is connected to the microprocessor through A/D conversion to calculate the angle.

As a further improvement of the present invention, each hard magnetic rotating wheel has a numerical scale of 0-n along the round face; n is an integer, 360 degrees is divided into n equal parts, and each arc corresponds to 360/n degrees; the microprocessor calculates the numerical scale corresponding to the hard magnetic rotating wheel based on the rotation angle recorded by the corresponding biaxial magnetoresistive angle sensor.

As a further improvement of the present invention, the automatic magnetic flow recording device also comprises an I/O module; the I/O module is either an electronic circuit system, near field communication system, or radio frequency system; after the output signal of each biaxial magnetoresistive angle sensor passes through the microprocessor, the flow information recorded by the automatic magnetic flow recording device is output by means of the I/O module.

As a further improvement of the present invention, the automatic magnetic flow recording device also comprises a battery; the battery is the power supply for the biaxial magnetoresistive angle sensor, switch selection circuit, microprocessor, and I/O module.

The present invention features the following benefits:

Compared to an X, Y biaxial angle sensor electronic water meter, the automatic magnetic flow recording device features mounting position flexibility, is influenced little by adjacent hard magnetic rotating wheels, and has the advantage of low power consumption.

EXPLANATION OF ATTACHED DRAWINGS

To more clearly explain the embodiments of the present invention or the technical schemes of existing technologies, a simple introduction to the attached drawings required by the description of the embodiments or existing technologies is given below. Obviously, the attached drawings of the description below are only a few embodiments recorded in the present invention. Those possessing ordinary skill in the art could obtain other drawings based upon these attached drawings without creative efforts.

SPECIFIC EMBODIMENTS

The following, together with the specific embodiments shown by the attached drawings, gives a detailed description of the present invention. However, these embodiments do not limit the present invention. All modifications to the structures, methods, or functions, based on these embodiments, made by those possessing ordinary skill in the art fall within the scope of protection of the present invention.

The present invention discloses an automatic magnetic flow recording device, comprising a plurality of coaxially disposed, hard magnetic rotating wheels; the hard magnetic rotating wheels are circular and have a predetermined turning ratio with respect to each other; each hard magnetic rotating wheel has at least one corresponding biaxial magnetoresistive angle sensor, and the biaxial magnetoresistive angle sensor measures the angular position of the hard magnetic rotating wheel within a range of 0-360 degrees; the biaxial magnetoresistive angle sensor comprises at least two single-axis linear magnetoresistive sensors, the single-axis linear magnetoresistive sensors are X axis magnetoresistive sensors or Z axis magnetoresistive sensors, the hard magnetic rotating wheel has a magnetization direction parallel to the diameter, the biaxial magnetoresistive angle sensor is positioned beyond the side surface of the cylinder of the corresponding hard magnetic rotating wheel, the X axis magnetoresistive sensor measures the magnetic field component tangential to the circumference of the hard magnetic rotating wheel at the position of the hard magnetic rotating wheel, and the Z axis magnetoresistive sensor measures the magnetic field component radial to the hard magnetic rotating wheel at the position of the hard magnetic rotating wheel.

Furthermore, the biaxial magnetoresistive angle magnetoresistive sensor of the present invention comprises an X axis magnetoresistive sensor chip or Z axis magnetoresistive sensor chip or single chip Z-X biaxial magnetoresistive angle sensor; the X axis magnetoresistive sensor chip or Z axis magnetoresistive sensor chip or single chip Z-X biaxial magnetoresistive angle sensor is located in the heightwise uniform magnetic field region of the corresponding permanent magnet rotating wheel.

The following refers to the attached drawings and, together with the embodiments, gives a detailed explanation of the present invention.

Embodiment 1

Figure 1:
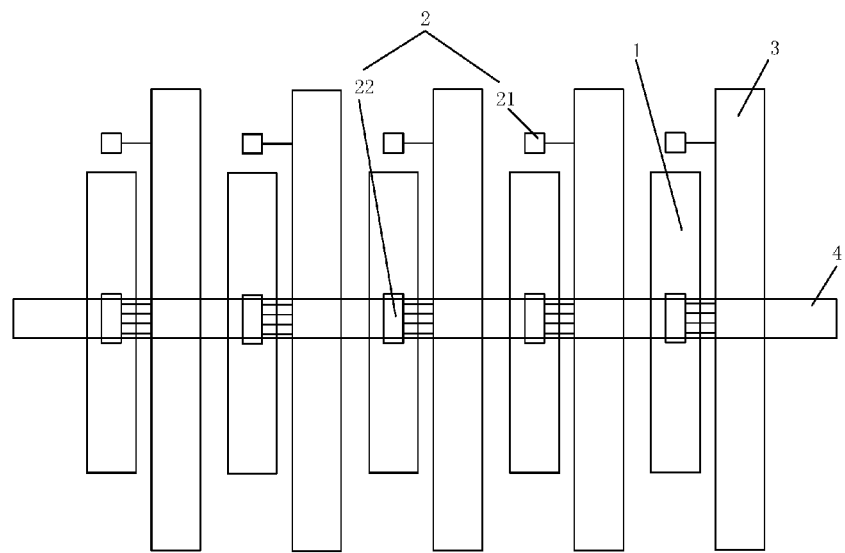
FIG. 1 is a front-view schematic diagram of a dual x axis magnetoresistive angle sensor or dual z axis magnetoresistive angle sensor direct reading electronic water meter of an embodiment of the present invention.
Figure 2:
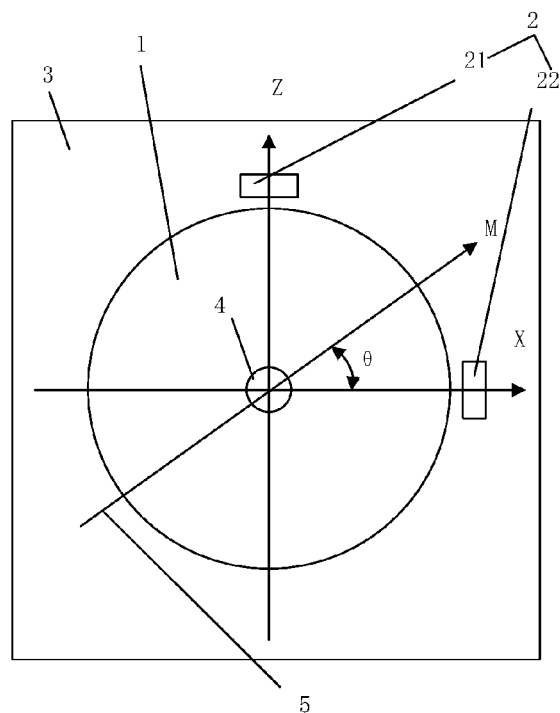
FIG. 2 is a side-view schematic diagram of a dual x axis magnetoresistive angle sensor or dual z axis magnetoresistive angle sensor direct reading electronic water meter of an embodiment of the present invention.

FIGS. 1 and 2 are the front view and side view, respectively, of a direct reading water meter comprising a dual x axis magnetoresistive angle sensor or dual z axis magnetoresistive angle sensor, wherein the biaxial magnetoresistive angle sensor 2 comprises dual x axis magnetoresistive angle sensor chips or dual z axis magnetoresistive sensor chips 21 and 22, and a plurality of hard magnetic rotating wheels 1. There is a predetermined transmission ratio between the hard magnetic rotating wheels 1, and the hard magnetic rotating wheels 1 have a shared axis of rotation 4. In addition, it also comprises a PCB 3 on which the biaxial magnetoresistive angle sensor 2 is mounted. The hard magnetic rotating wheels 1 have a cylindrical structure, wherein dual x axis magnetoresistive angle sensor chips or dual z axis magnetoresistive sensor chips 21 and 22 are located beyond the side surface of the cylinder of the hard magnetic rotating wheel 1 or the plane of extension of the side surface of the cylinder. Their vertical distance from the side surface of the cylinder of the hard magnetic rotating wheel 1 of the permanent magnetic rotating wheel or from the plane of extension of the side surface of the cylinder is the same, and they are located at two positions spanning the round face at a 90 degree arc. In addition, the hard magnetic rotating wheels 1 have a magnetization direction 5 parallel to the diameter. Here, the dual x axis magnetoresistive angle sensor chips or dual z axis magnetoresistive sensor chips have the same magnetic field sensitivity.

Embodiment 2

Figure 3:
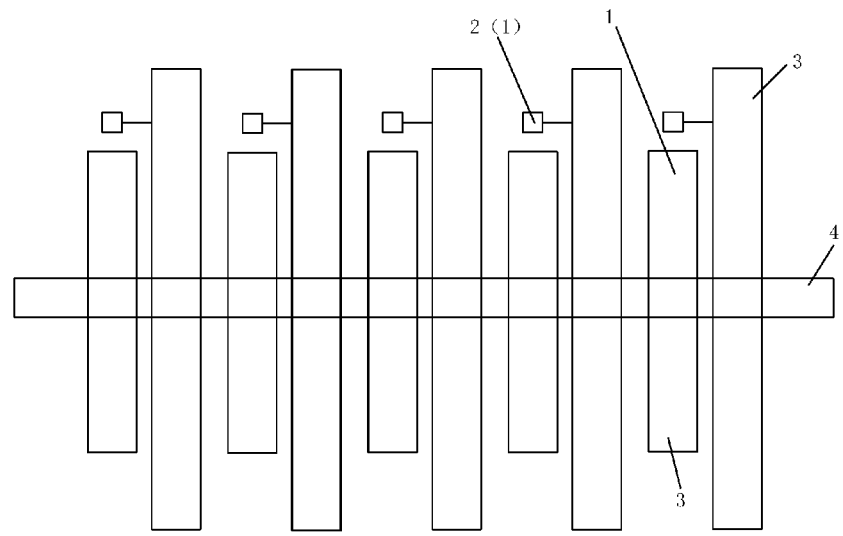
FIG. 3 is a front-view schematic diagram of the single chip Z-X biaxial magnetoresistive angle sensor direct reading electronic water meter of Embodiment 2 of the present invention.
Figure 4:
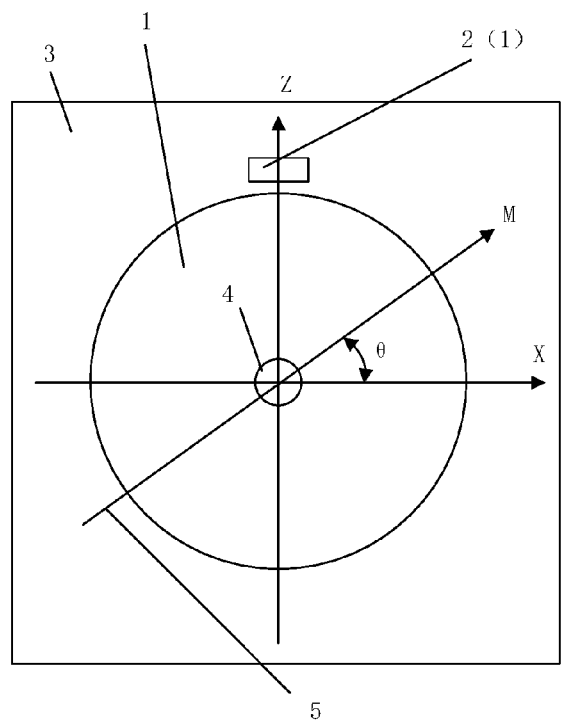
FIG. 4 is a side-view schematic diagram of the single chip Z-X biaxial magnetoresistive angle sensor direct reading electronic water meter of Embodiment 2 of the present invention.

FIGS. 3 and 4 are the front view and side view, respectively, of a direct reading water meter comprising a single chip Z-X biaxial magnetoresistive angle sensor, wherein 2(1) is the single chip Z-X biaxial magnetoresistive angle sensor, positioned above the circumference of the permanent magnetic rotating wheel 1.

In addition, single chip Z-X biaxial magnetoresistive angle sensor 2(1) of this embodiment can be replaced by a Z axis magnetoresistive sensor chip and X axis magnetoresistive angle sensor chip in the same position. As a matter of convenience, a separate chip diagram is not presented.

It should be noted that the sensitive Z direction of the Z axis magnetoresistive sensor chip and single chip Z-X biaxial magnetoresistive angle sensor corresponds to the radial direction of the circumference of the hard magnetic rotating wheel at the position of the sensor chip. The sensitive direction of the X axis magnetoresistive sensor chip and the X axis magnetoresistive sensor of the single chip Z-X biaxial magnetoresistive angle sensor corresponds to the tangential direction of the circumference of the hard magnetic rotating wheel at the position of the sensor chip.

When the three types of biaxial magnetoresistive angle sensors of Embodiment 1 and Embodiment 2 are used in direct reading water meters, angle measurements of each permanent magnetic rotating wheel are separately conducted, the positions of the rotating wheels are determined, then using the predetermined transmission ratio relationship between the rotating wheels, the water meter's total number of revolutions is read out directly.

For a biaxial magnetoresistive angle sensor with two separate chips, such as dual x axis magnetoresistive sensor chips or dual z axis magnetoresistive sensor chips, the positional relationship between it and its corresponding permanent magnetic rotating wheels is as shown in FIG. 2. Here, the angle of intersection between the X axis and the direction of magnetization intensity parallel to a straight line in the direction of the diameter is θ, and it is used to represent the rotation angle. The magnetic fields at the location of the dual x axis magnetoresistive angle sensor chips or dual z axis magnetoresistive sensor chips 21 and 22 are (HX1, HZ1) and (HX2, HZ2), respectively. HX1 and HZ1 are the magnetic field components at position 21, and HX2 and HZ2 are the magnetic field components at position 22.

Therefore, for a dual x axis magnetoresistive angle sensor chip, the measured magnetic field angle relationship is:

$$\varphi = a\tan(HX2/HZ1), HZ1>0;$$

$$\varphi = \pi - a\tan(HX2/HZ1), HZ1<0, HX2<0;$$

$$\varphi = \pi + a\tan(HX2/HZ1), HZ1<0, HX2>0,$$

Here, the magnetic field measurement signals for the dual x axis magnetoresistive sensors are HX2 and HZ1, respectively.

For a dual z axis magnetoresistive angle sensor and single chip Z-X magnetoresistive angle sensor, their measured magnetic field angle relationships in relation to the rotating wheel rotation angle relationships are as set forth in patents 2014104116280 and 2014104061428, respectively.

Figure 5:
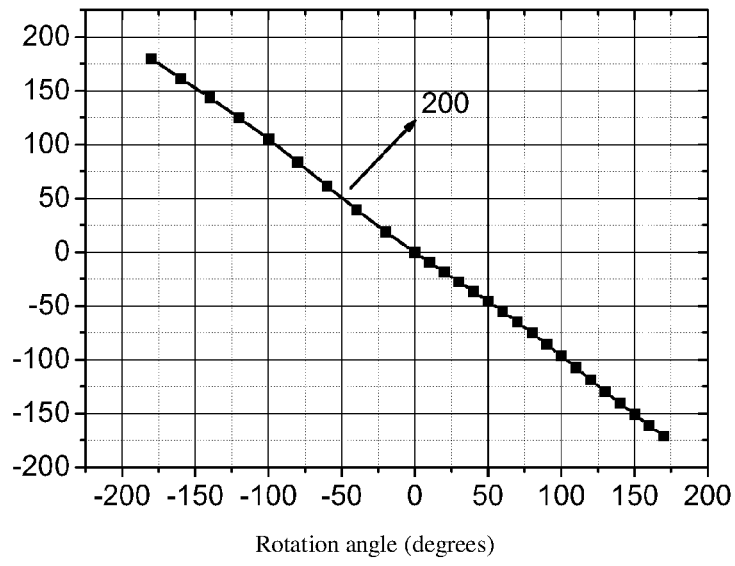
FIG. 5 is a relation curve graph between a typical magnetic field angle of the biaxial magnetoresistive angle sensor and the rotation angle of a hard magnetic rotating wheel of the present invention.
Figure 6:
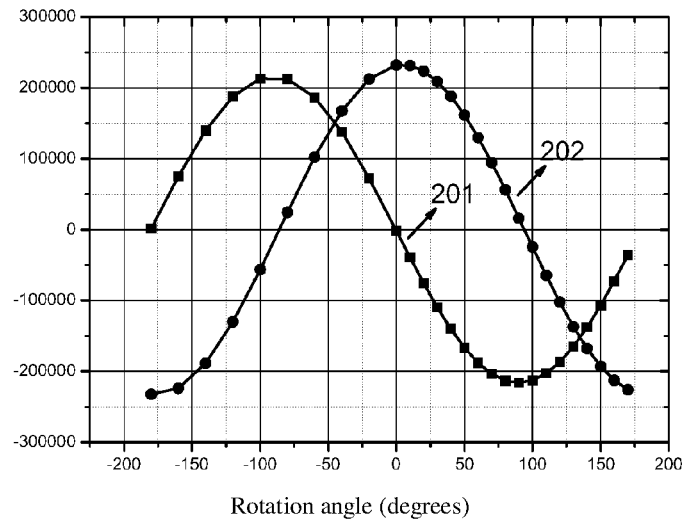
FIG. 6 is a relation curve graph between two typical output signals of the biaxial magnetoresistive angle sensor and the rotation angle of a hard magnetic rotating wheel of the present invention.

With regard to a biaxial magnetoresistive angle sensor, during measurement of detected hard magnetic rotating wheels, a typical relationship curve between measured magnetic field and rotation angle and the output signals for two measured magnetic fields are shown in FIGS. 5 and 6, respectively. The curve 200 has a typical linear relationship, and the two sensors' measured magnetic field signals are as shown in curves 201 and 202, respectively. The two feature typical sine/cosine curve characteristics, and the phase difference is approximately 90 degrees. Therefore, it is entirely suitable to use a biaxial magnetoresistive angle sensor to measure hard magnetic rotating wheels, and thus design a read-only water meter comprising a biaxial magnetoresistive angle sensor.

It should be noted that for dual x axis magnetoresistive angle sensors, dual z axis magnetoresistive angle sensors, and Z-X biaxial magnetoresistive angle sensors, it is necessary to use the distance relationship between the magnetoresistive sensor chip and hard magnetic rotating wheels as a basis, and to consider the magnetic interference among the plurality of hard magnetic rotating wheels to optimize the distance between the magnetoresistive sensor and hard magnetic rotating wheels. In addition, regarding the substrate spacing of the Z axis magnetoresistive sensor or Z axis magnetoresistive sensor unit and Z axis magnetoresistive sensor or X axis magnetoresistive sensor unit on a single chip Z-X biaxial magnetoresistive angle sensor, it is necessary to consider the magnetic interference among the plurality of hard magnetic rotating wheels for optimization, to ensure that the biaxial angle sensor is located in the linear operation region of the correlation between magnetic field angle and rotating wheel rotation angle.

In addition, a key issue is that of magnetic field interference among the plurality of hard magnetic rotating wheels, with regard to the multiple hard magnetic rotating wheel structure of a water meter. Soft magnetic materials are commonly used for magnetic field shielding of the hard magnetic rotating wheels, to reduce the magnetic field interference between adjacent hard magnetic rotating wheels.

Embodiment 3

Figure 7:
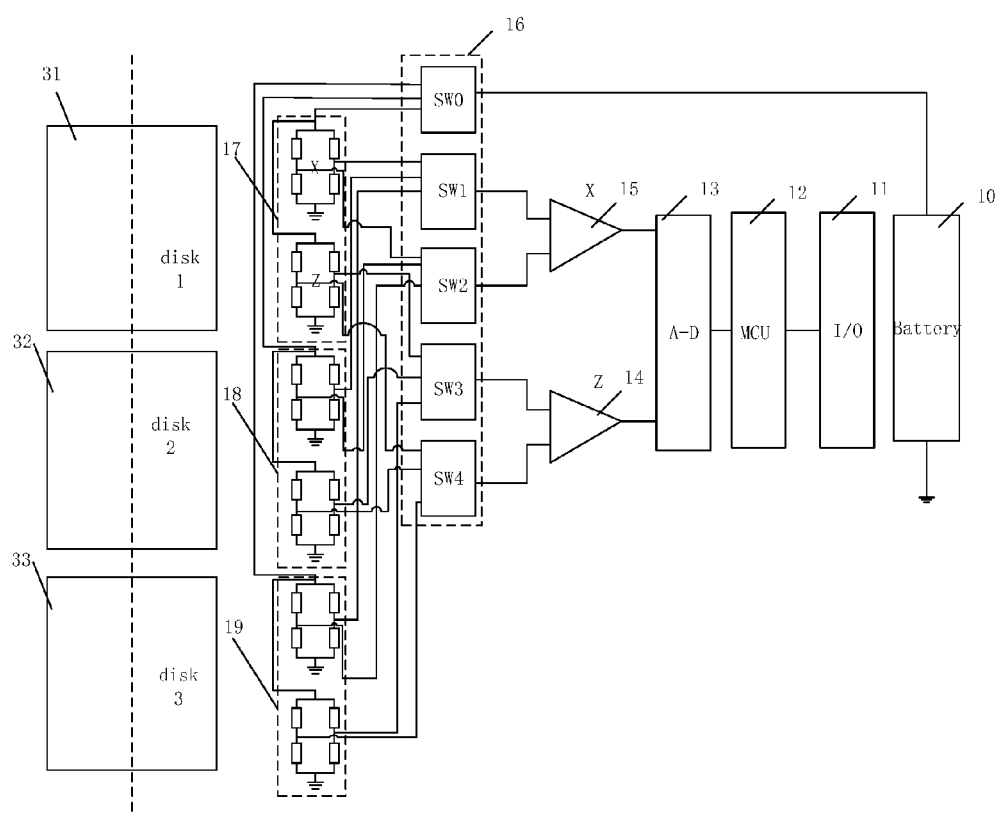
FIG. 7 is the signal processing circuit diagram of the automatic magnetic flow recording device of Embodiment 3 of the present invention.

FIG. 7 is the signal processing circuit diagram of the automatic magnetic flow recording device. It uses 3 hard magnetic rotating wheels as an example to give an explanation, and it is similarly applicable to other numbers of hard magnetic rotating wheels. 17, 18, and 19 are the biaxial magnetoresistive angle sensors corresponding to hard magnetic rotating wheels 31, 32 and 33. In the present embodiment, the hypothetical situation is that any given biaxial magnetoresistive angle sensor comprises a single-axis magnetoresistive angle sensor with a two full-bridge structure; it is similarly applicable to other types, such as single-axis angle sensors with a half bridge or quasi-bridge structure.

The power source output terminals of the biaxial magnetoresistive angle sensors 17, 18 or 19 are connected to the battery 10 through a SW0 in the switch selection circuit 16. Only when a biaxial magnetoresistive angle sensor is in operating mode is its power source signal terminal connected; when it is not in operating mode, the power source is in off-mode, to conserve power.

Similarly, the signal output terminals of the biaxial magnetoresistive angle sensors are connected to the signal amplifiers 15 and 14 through SW1, SW2, SW3, and SW4 of the switch selection circuit 16, respectively. When a biaxial magnetoresistive angle sensor is in operating mode, the output signal terminals of its two corresponding single-axis linear magnetoresistive sensors are connected by the switch selection circuit 16; thus, each is able to enter a signal amplifier. In a single-axis linear magnetoresistive sensor with a full bridge structure, the signal amplifier is a differential signal amplifier; in half bridge structure, it is a single input signal amplifier.

After the output signals of the two single-axis linear magnetoresistive sensors in a biaxial magnetoresistive angle sensor separately pass through the A-D converter 13, they are transformed into digital signals and enter the MCU microprocessor 12, undergo calculations, and are transformed into angle information. Because each hard magnetic rotating wheel has a numerical scale of 0-10 along the round face, 360 degrees are equally divided into 10 parts, and each arc corresponds to 36 degrees. Based on the rotation angle recorded by the corresponding biaxial magnetoresistive angle sensor, the microprocessor goes on to calculate the numerical scale corresponding to this hard magnetic rotating wheel. After separately reading the signal for each permanent magnetic rotating wheel, the total number of revolutions is acquired. MCU microprocessor 12 outputs the calculated information through the I/O module 11. Here, the I/O module can be either an electronic circuit system, near field communication system, or radio frequency system. Also, in addition to providing each biaxial magnetoresistive angle sensor with a power source, the battery 10 provides the switch circuit 16 and signal amplifiers 15 and 14, as well as the A-D converter 13, MCU microprocessor 12, and I/O module 11 with a power source.

In the automatic magnetic flow recording device of the preceding embodiments, a direct reading water meter is used as an example to give an explanation. In other embodiments, the present invention applies to various liquid or gas direct reading measurements and their displays.

The preceding technical schemes show that the hard magnetic rotating wheels of the present invention's automatic magnetic flow recording device correspond to at least one biaxial magnetoresistive angle sensor, and the biaxial magnetoresistive angle sensor comprises at least two single-axis linear magnetoresistive sensors. Compared to an X, Y biaxial angle sensor electronic water meter, it features mounting position flexibility, is influenced little by adjacent hard magnetic rotating wheels, and has the advantage of low power consumption.

For those skilled in the art, clearly the present invention is not limited to the details of the preceding exemplary embodiments, and it is possible to embody the present invention through other specific forms, provided that they do not deviate from the spirit and basic characteristics of this invention. Therefore, regardless of the point of view, the embodiments shall be viewed as exemplary and non-restrictive. The scope of the present invention is defined by the appended Claims and not by the preceding explanation. Therefore, the purpose is to include within the present invention all changes falling within the meaning and scope of the equivalent elements of the Claims. No markings in the attached drawings of the Claims shall be viewed as limiting the involved Claims.

In addition, it should be understood that even though this Description provides a description according to the embodiments, it is not the case that every embodiment only comprises an independent technical scheme. The narrative approach of the Description is merely for the sake of clarity. Those skilled in the art should view the Description as a whole, and through appropriate combination, the technical schemes of the embodiments can be made to form other embodiments understandable to those skilled in the art.

The invention claimed is:

1. An automatic magnetic flow recording device, wherein the automatic magnetic flow recording device comprises:
    a plurality of coaxially disposed magnets, each of the magnets having one magnetization direction, and each of the magnets having a wheel shape, wherein the plurality of coaxially disposed magnets form a plurality of coaxially disposed hard magnetic rotating wheels,
    wherein each of the hard magnetic rotating wheels has a cylindrical shape with a center axis and a side surface, a circular cross section in a plane perpendicular to the center axis, and a circumference, has one magnetization direction parallel to a diameter, and has a predetermined turning ratio with respect to other ones of the hard magnetic rotating wheels;
    wherein each of the hard magnetic rotating wheels has at least one corresponding biaxial magnetoresistive angle sensor in the plane of the circular cross section,
    wherein the biaxial magnetoresistive angle sensor is configured to measure angular positions of the corresponding hard magnetic rotating wheel throughout a range of 0-360 degrees of rotation for the corresponding hard magnetic rotating wheel;
    wherein the biaxial magnetoresistive angle sensor comprises at least one substrate, each substrate defining an X-Y plane where the X-Y plane has an X-axis direction and a Y-axis direction perpendicular to the X-axis direction and further defining a Z-axis direction perpendicular to the X-Y plane and extending away from the substrate, wherein the biaxial magnetoresistive angle sensor includes at least two uniaxial linear magnetoresistive sensors, wherein the at least two uniaxial linear magnetoresistive sensors include at least one Z-axis magnetoresistive sensor configured to sense in the Z-axis direction,
    wherein the biaxial magnetoresistive angle sensor is positioned in the plane and beyond the side surface of the cylindrical shape of the corresponding hard magnetic rotating wheel such that a distance from the center axis to the side surface is less than a distance from the center axis to the biaxial magnetoresistive sensor, wherein the substrate is arranged to provide the X-axis direction tangential to the circumference of the hard magnetic rotating wheel and the Z-axis magnetoresistive sensor is a single-axis linear magnetoresistive sensor arranged to provide the Z-axis direction radial to the hard magnetic rotating wheel.

2. The automatic magnetic flow recording device according to claim 1,
    wherein the biaxial magnetoresistive angle sensor is located in a heightwise uniform magnetic field region of the corresponding permanent magnetic rotating wheel.

3. The automatic magnetic flow recording device according to claim 2,
    wherein the automatic magnetic flow recording device also comprises a PCB, and the biaxial magnetoresistive angle sensor is directly connected to the PCB.

4. The automatic magnetic flow recording device according to claim 1,
    wherein the biaxial magnetoresistive angle sensor comprises dual Z-axis magnetoresistive sensor chips configured to sense in the Z-axis direction or one X-Z biaxial magnetoresistive sensor configured to sense in both the X-axis direction and the Z-axis direction, and the Z axis magnetoresistive sensor chips have the same magnetic field sensitivity.

5. The automatic magnetic flow recording device according to claim 4,
    wherein the biaxial magnetoresistive angle sensor is a pair of Z axis magnetoresistive angle sensors, comprising dual z axis magnetoresistive sensor chips; the Z axis magnetoresistive sensor chips comprise at least one Z axis magnetoresistive sensor unit, and the dual z axis magnetoresistive sensor chips are located at two positions over the circumference of the corresponding hard magnetic rotating wheel spanning a 90-degree arc and at the same distance away from the circumference of the hard magnetic rotating wheel.

6. The automatic magnetic flow recording device according to claim 4,
    wherein the biaxial magnetoresistive angle sensor is a single chip X-Z biaxial magnetoresistive angle sensor, comprising an X axis magnetoresistive sensor configured to sense in the X-axis direction and a Z axis magnetoresistive sensor configured to sense in the Y-axis direction integrated on the same substrate; the single chip X-Z biaxial magnetoresistive angle sensor is positioned above the circumference of the corresponding hard magnetic rotating wheel.

7. The automatic magnetic flow recording device according to claim 1, wherein there are soft magnetic materials between the hard magnetic rotating wheels for magnetic shielding to reduce magnetic field interference among the hard magnetic rotating wheels.

8. The automatic magnetic flow recording device according to claim 1, further comprising a switch selection circuit, wherein the switch selection circuit controls a connection and disconnection of a power source input terminal of each biaxial magnetoresistive angle sensor to a power source;

wherein the switch selection circuit is configured to place the biaxial magnetoresistive angle sensor for the corresponding hard magnetic wheel in operating mode when information is read from the corresponding hard magnetic wheel;

wherein the switch circuit is configured to place the biaxial magnetoresistive angle sensor for the corresponding hard magnetic rotating wheel in power-off mode when the hard magnetic wheel is not read.

9. The automatic magnetic flow recording device according to claim 8, further comprising a microprocessor;

wherein an output signal of the biaxial magnetoresistive angle sensor is connected to the microprocessor through A/D conversion to calculate the angle.

10. The automatic magnetic flow recording device according to claim 9, wherein each of the hard magnetic rotating wheels has a numerical scale of 0-n equally distributed along the round face, wherein n is an integer and 360 degrees are divided into n equal parts;

wherein the microprocessor calculates the numerical scale corresponding to the hard magnetic rotating wheel based on the rotation angle recorded by the corresponding biaxial magnetoresistive angle sensor.

11. The automatic magnetic flow recording device according to claim 9, further comprising an I/O module, wherein the I/O module is any one of an electronic circuit system, near field communication system, or radio frequency system;

wherein after the output signal of each biaxial magnetoresistive angle sensor passes through the microprocessor after flow information recorded by the automatic magnetic flow recording device is output by means of the I/O module.

12. The automatic magnetic flow recording device according to claim 11, further comprising a battery, wherein the battery is the power supply for the biaxial magnetoresistive angle sensor, switch selection circuit, microprocessor, and I/O module.

13. The automatic magnetic flow recording device according to claim 1, wherein the biaxial magnetoresistive angle sensor comprises a single chip Z-X biaxial magnetoresistive sensor configured to sense in both the X-axis direction and the Z-axis direction.

\* \* \* \* \*